United States Patent
Meunier et al.

(10) Patent No.: US 12,081,224 B2
(45) Date of Patent: Sep. 3, 2024

(54) METHOD FOR COMMUNICATING A REFERENCE TIME BASE IN A MICROCONTROLLER, AND CORRESPONDING MICROCONTROLLER INTEGRATED CIRCUIT

(71) Applicants: STMicroelectronics (Rousset) SAS, Rousset (FR); STMicroelectronics (Grand Ouest) SAS, Le Mans (FR)

(72) Inventors: Laurent Meunier, Coulaines (FR); Vincent Pascal Onde, Fuveau (FR)

(73) Assignees: STMicroelectronics (Rousset) SAS, Rousset (FR); STMicroelectronics (Grand Ouest) SAS, Le Mans (FR)

( * ) Notice: Subject to any disclaimer, the term of this patent is extended or adjusted under 35 U.S.C. 154(b) by 70 days.

(21) Appl. No.: 17/807,452

(22) Filed: Jun. 17, 2022

(65) Prior Publication Data
US 2023/0006684 A1 Jan. 5, 2023

(30) Foreign Application Priority Data
Jun. 30, 2021 (FR) ...................................... 2107062

(51) Int. Cl.
| | | |
|---|---|---|
| G06F 7/24 | (2006.01) | |
| G06F 1/14 | (2006.01) | |
| G06F 9/48 | (2006.01) | |
| H03L 7/099 | (2006.01) | |
| H03L 7/24 | (2006.01) | |

(52) U.S. Cl.
CPC .................. *H03L 7/24* (2013.01); *G06F 1/14* (2013.01); *G06F 9/4812* (2013.01); *H03L 7/0992* (2013.01)

(58) Field of Classification Search
CPC . H03L 7/24; H03L 7/0992; G06F 1/14; G06F 9/4812
See application file for complete search history.

(56) References Cited

U.S. PATENT DOCUMENTS

| | | | |
|---|---|---|---|
| 6,735,454 B1 * | 5/2004 | Yu ..................... | H04W 52/0293 455/343.1 |
| 10,172,092 B1 * | 1/2019 | Zhou ........................ | G06F 1/08 |
| 2006/0149984 A1 | 7/2006 | Yasumoto | |
| 2007/0165594 A1 * | 7/2007 | Heinle ...................... | H03L 7/00 370/503 |
| 2007/0168687 A1 | 7/2007 | Brokish | |
| 2019/0196563 A1 * | 6/2019 | Lai .......................... | G06F 1/324 |
| 2023/0299778 A1 * | 9/2023 | Kumar ..................... | H03L 7/24 327/291 |

FOREIGN PATENT DOCUMENTS

WO 2013009918 A1 1/2013

* cited by examiner

*Primary Examiner* — Zahid Choudhury
(74) *Attorney, Agent, or Firm* — Slater Matsil, LLP

(57) ABSTRACT

In an embodiment a method includes generating a low-frequency clock signal having a first frequency, in a standby mode and in a run mode of the CPU, generating a high-frequency clock signal having a second frequency higher than the first frequency, in the run mode, updating a value of the reference time base at each period of the low-frequency clock signal in the standby mode, and accessing the counter register with the high-frequency clock signal in the run mode.

20 Claims, 7 Drawing Sheets

METHOD FOR COMMUNICATING A REFERENCE TIME BASE IN A MICROCONTROLLER, AND CORRESPONDING MICROCONTROLLER INTEGRATED CIRCUIT

CROSS-REFERENCE TO RELATED APPLICATIONS

This application claims the benefit of French Patent Application No. 2107062, filed on Jun. 30, 2021, which application is hereby incorporated herein by reference.

TECHNICAL FIELD

Embodiments and implementations relate to integrated circuits, in particular microcontrollers and the communication of a reference time base for the operations of microcontrollers.

BACKGROUND

The operating systems executed by relatively simple application microcontrollers, for example an operating system of a microcontroller of a connected object, are based on hardware clocks for maintaining a reference time of the system.

The hardware clocks are typically formed by a counter incremented, or updated, by the clock cycles of a clock signal.

The operating systems use this reference time of the system as a major element of their planners, to maintain a complete list of execution times of software tasks and the precise instants in the planning of tasks. The operating systems also often read the reference time of the system to adapt to it and to compare it with a theoretical time.

Consequently, there may be significant access to the counter providing the reference time during the software activities of the operating system, which involve numerous (re)-plannings, and therefore significant read access of the counter and significant write access to program interrupts in the comparator registers.

It may be considered that there are typically two categories of hardware clocks, one known as low consumption, the other known as general purpose. Low-consumption clocks are typically clocked by a low-frequency clock signal, for example 32 kHz, and operate continuously, in particular during low consumption, called "standby", modes. General-purpose clocks are typically clocked by a high-frequency clock signal, for example of a few MHz, and operate in a run mode, and, in particular, do not operate during standby modes, the oscillator generating the high-frequency clock signal being deactivated in order to reduce the power consumption.

Consequently, the use of the general purpose hardware clock enables rapid access to the counter, but the hardware clock cannot be used in standby mode, so that the time reference is lost during the entry into standby mode and the hardware clock cannot be used to program a wake-up of the system.

The general-purpose hardware clock is therefore conventionally not used to provide the reference time of the system.

The use of the low-consumption hardware clock may for its part be used in standby mode, and be used to program a wake-up of the system, but the access to the counter is slow due to the low frequency of the clock signal that clocks it.

Indeed, typically a plurality of clock cycles are needed to program interrupts in a comparator register, for example three clock cycles at 32 kHz last around one hundred µs. During this time, the central processing unit of the operating system, which operates at high speed (in the order of 100 MHz), sometimes attempts to program a new value of the comparator, which is not possible.

In addition, the planning operations of the operating system may take place in a critical section, that is to say when the interrupts are deactivated. An access to the counter of long duration therefore increases the time spent in critical section. The reactivity of the system is affected. In the worst case, events or data received from certain peripherals may be lost.

Moreover, the resolution of the counter is low because it is based on the low frequency, and therefore the programmed interrupt instant may not be very precise.

Conventionally, to overcome these problems of highly complex and consuming software solutions computing resources are implemented and the throughput of communications with the peripherals is limited below its capacity.

SUMMARY

Embodiments provide communication of a value of a reference time base that may both operate in a standby mode and not having the problems of reducing the reactivity of the system, of limiting the throughput of communications, by avoiding complex software solutions.

Further embodiments provide a high-speed and low-consumption hardware clock.

According to one embodiment, a method is proposed for communicating a value of a reference time base contained in a counter register accessible by a microcontroller central processing unit that may have an operation in standby mode and in run mode, comprising generating a so-called low-frequency clock signal having a first frequency, in the standby mode and in the run mode, and generating a so-called high-frequency clock signal having a second frequency higher than the first frequency, in the run mode, wherein the value of the reference time base is updated at each period of the low-frequency clock signal in the standby mode, and the access to the counter register is clocked with the high-frequency clock signal in the run mode.

For example, the first frequency is lower than 1 MHz (megahertz) or even lower than 100 kHz (kilohertz), and the second frequency is higher than 1 MHz. In practice, the first frequency may be between 32 kHz and 300 kHz (for example a quartz at 32.768 kHz), and the second frequency may be between 4 MHz and 500 MHz.

In other terms, it is proposed to provide a time base operating both in standby mode and in run mode, with a low-latency (fast) read and write access in the run mode.

For example, the counter register may indeed include a read register read accessible by the central processing unit and containing said value of the reference time base, as well as a comparison register write accessible by the central processing unit and containing a value of a programmed interrupt instant.

According to one implementation, the value of the reference time base is updated by an increment corresponding to the first frequency, at each period of the low-frequency clock signal in the standby mode, and is updated by an increment corresponding to the second frequency, at each period of the high-frequency clock signal in the run mode.

Thus, further to the fast access to the counter register in the run mode, the value of the reference time base benefits from a finer resolution.

Advantageously, the value of the reference time base updated at each period of the high-frequency clock signal in the run mode is realigned on each period of the low-frequency clock signal, the realignment comprising either a jump to the next value equal to a multiple of the ratio of the second frequency to the first frequency at the end of said period of the low-frequency clock signal, or a stop on a value equal to a multiple of said ratio until the end of said period of the low-frequency clock signal.

This corresponds in other terms to a compensation for a possible drift between the first frequency of the low-frequency clock signal and the second frequency of the high-frequency clock signal, in a disciplined manner by the low-frequency clock signal (that is to say that the low-frequency clock signal is taken as reference to compensate for the drift).

According to another implementation, the value of the reference time base of the counter register accessible by the central processing unit is updated at each period of the low-frequency clock signal in the run mode.

In other terms, in the run mode, the counter register is updated slowly at the first frequency, but is rapidly accessible at the second frequency, particularly if applicable during write in the comparison register, due to the clocking of the counter register by the high-frequency clock signal.

Advantageously, a value of the reference time base contained by a root counter register is updated at each period of the low-frequency clock signal in the standby mode and in the run mode, the value of the reference time base of the counter register accessible by the central processing unit being synchronised on the value of the reference time base of the root counter register, at each period of the low-frequency clock signal, in the run mode.

"Root counter" means in the present scope, a counter that is not directly accessible by an external element (in particular by the central processing unit), but which is used to generate a value intended to be recopied (synchronised) in the counter register accessible by the central processing unit.

In other terms, a low-frequency hardware clock is duplicated in a high-frequency domain to enable rapid access to the counter register. The synchronisation corresponds for example to a copy of the values from one register to the other.

According to another implementation, the counter register accessible by the central processing unit contains high weight bits and low weight bits of the value of the reference time base, and the value of high weight bits is synchronised on the value of the reference time base of the root counter register at each period of the low-frequency clock signal in the run mode, the value of the low weight bits being updated at each period of the high-frequency clock signal in the run mode.

This corresponds in other terms to a hardware clock combining a slow hardware clock always available and a fast hardware clock available in the run mode.

Advantageously, the value of the low weight bits is realigned on each period of the low-frequency clock signal, the realignment comprising either resetting the low weight bits at the end of said period of the low-frequency clock signal, or locking the value of the low weight bits at a limit value equal to the ratio of the second frequency to the first frequency, until the end of said period of the low-frequency clock signal.

Advantageously, the value of the programmed interrupt instant contained in the comparison register belonging to the counter register write accessible by the central processing unit, is synchronised in a comparison register belonging to the root counter register before each transition from the run mode to the standby mode.

According to another embodiment, a microcontroller integrated circuit is also proposed that may have an operation in standby mode and in run mode, comprising a central processing unit, and a time reference circuit including a counter register configured to contain a value of a reference time base and accessible by the central processing unit, a first clock circuit configured to generate a so-called low-frequency clock signal having a first frequency, in the standby mode and in the run mode, and a second clock circuit configured to generate a so-called high-frequency clock signal having a second frequency higher than the first frequency, in the run mode, wherein the time reference circuit is configured to update the value of the reference time base at each period of the low-frequency clock signal in the standby mode, and to clock the access to the counter register with the high-frequency clock signal in the run mode.

For example, the counter register may include a read register read accessible by the central processing unit and containing said value of the reference time base, as well as a comparison register write accessible by the central processing unit and containing a value of a programmed interrupt instant.

According to one embodiment, the time reference circuit includes a logic circuit configured to update the value of the reference time base by an increment corresponding to the first frequency, at each period of the low-frequency clock signal in the standby mode, and to update the value of the reference time base by an increment corresponding to the second frequency, at each period of the high-frequency clock signal in the run mode.

Advantageously, the time reference circuit further includes a drift compensation circuit configured to control the logic circuit in such a way as to realign the value of the reference time base updated at each period of the high-frequency clock signal in the run mode on each period of the low-frequency clock signal, the realignment comprising either a jump to the next value equal to a multiple of the ratio of the second frequency to the first frequency at the end of said period of the low-frequency clock signal, or a stop on a value equal to a multiple of said ratio until the end of said period of the low-frequency clock signal.

According to another embodiment, the time reference circuit is further configured to update the value of the reference time base of the counter register accessible by the central processing unit at each period of the low-frequency clock signal in the run mode.

Advantageously, the time reference circuit further includes a root counter register configured to contain a value of the reference time base updated at each period of the low-frequency clock signal in the standby mode and in the run mode, the time reference circuit being configured to synchronise the value of the reference time base of the counter register accessible by the central processing unit on the value of the reference time base of the root counter register, at each period of the low-frequency clock signal, in the run mode.

According to another embodiment, the counter register accessible by the central processing unit is adapted to contain high weight bits and low weight bits of the value of the reference time base, the time reference circuit is configured to synchronise the value of said high weight bits on the value of the root counter register, at each period of the low-frequency clock signal, in the run mode, and to update the value of said low weight bits of the value of the reference time base at each period of the high-frequency clock signal in the run mode.

Advantageously, the counter register accessible by the central processing unit is configured to realign the value of the low weight bits on the low-frequency clock signal, the realignment comprising either resetting the low weight bits at the end of said period of the low-frequency clock signal, or locking the value of the low weight bits at a limit value equal to the ratio of the second frequency to the first frequency, until the end of said period of the low-frequency clock signal.

Advantageously, the root counter register includes a comparison register, the time reference circuit being configured to synchronise a value of a standby mode programmed interrupt instant in the comparison register of the root counter register, on the value of the programmed interrupt instant contained in the comparison register belonging to the counter register write accessible by the central processing unit, before each transition from the run mode to the standby mode.

BRIEF DESCRIPTION OF THE DRAWINGS

Other advantages and features of the invention will become apparent upon examination of the detailed description of non-limiting embodiments and implementations, and the appended drawings, wherein.

DETAILED DESCRIPTION OF ILLUSTRATIVE EMBODIMENTS

Figure 1:
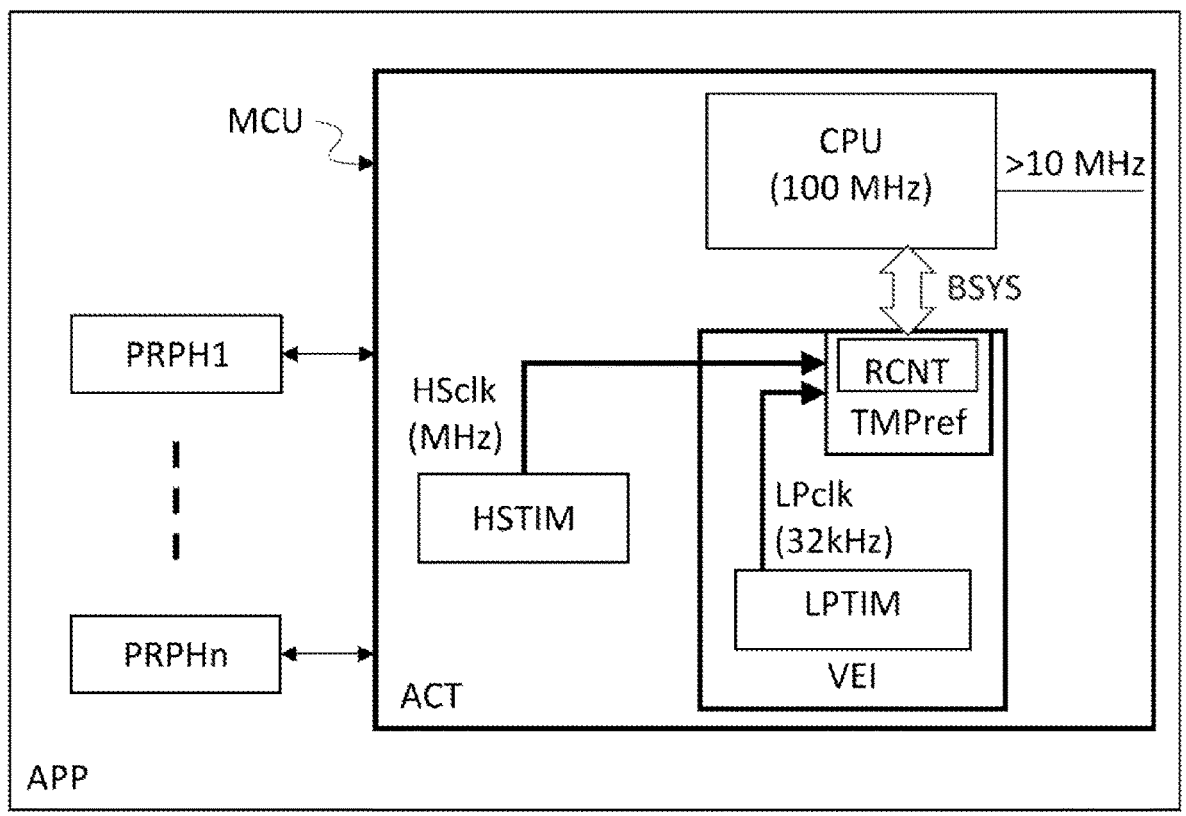
FIG. 1 illustrates an embodiment of a microcontroller.

FIG. 1 illustrates a microcontroller MCU produced in an integrated manner in an integrated circuit, and for example intended to economically equip a simple appliance APP, of the connected object type ("IoT" for "Internet of Things").

Indeed, the microcontrollers MCU of connected objects, such as for example audio, home automation, or household electrical appliances, implement operating systems having relatively simple functions, particularly in relation to multifunction telephone or computer microcontrollers. The functions implemented in the connected objects are usually the control and the management of peripherals PRPH1-PRPHn of the appliance APP, typically wireless communication peripherals, or also a display device, and the peripherals specific for the primary purpose of the object.

Furthermore, in the connected objects, the energy consumption of the microcontrollers MCU is typically constrained to the economy.

The microcontroller MCU includes a central processing unit CPU, adapted to implement software operations, in particular the operating system.

The operations of the central processing unit may be clocked by an internal clock signal having a frequency in the order of around one hundred MHz (megahertz), and generates output and control signals at frequencies that may be in the order of tens of MHz or more. However, the frequencies of the output and control signals are adapted to communications with the peripherals to which the signals are transmitted, and may be in the order of tens of kHz for the inputs-outputs, of hundreds of kHz for asynchronous serial links (for example a "UART" for "Universal Asynchronous Receiver Transmitter" link), and of tens of MHz for fast serial links (for example an "SPI" for "Serial Peripheral Interface" link).

The microcontroller MCU may have an operation in standby mode (VEI) and in run mode (ACT), and a distinction is made in this regard to a VEI domain relating to the standby mode, that may be called "standby domain" or "always on domain" and an ACT domain relating to the run mode, that may be called "run domain".

The standby domain VEI includes a first clock circuit LPTIM, configured to generate a first so-called "low frequency" clock signal LPclk, having a first frequency. The first clock circuit LPTIM is configured to generate the low-frequency clock signal LPclk in the standby mode as well as in the run mode of the microcontroller MCU. The first clock circuit LPTIM in particularly optimised for a low-energy consumption, and may constitute a stable time reference for the system.

For example, the first frequency is in the order of the kHz (kilohertz), for example 32 kHz.

The run domain ACT includes a second clock circuit HSTIM configured to generate a second so-called "high frequency" clock signal HSclk, having a second frequency higher than the first frequency. The second clock circuit LPTIM is configured to generate the high-frequency clock signal HSclk in the run mode. The second clock circuit HSTIM consumes more energy than the first clock circuit LPTIM and is particularly deactivated in the standby mode.

For example, the second frequency is in the order of the MHz (megahertz), for example 10 MHz or more.

The microcontroller includes a time reference circuit TMPref including a counter register RCNT configured to contain a value of a reference time base. The counter register RCNT is accessible by the central processing unit CPU, for example via a system bus BSYS adapted for internal communication of the integrated circuit MCU.

Indeed, the operating system from a software point of view, or the central processing unit from a hardware point of view, uses the reference time base to plan its activity, that is to say to maintain the complete list of execution times of software application tasks and the precise instants of the planning of tasks, and also to adapt on the reference time base and compare it to a theoretical time.

The time reference circuit TMPref is configured to update the value of the reference time base contained in the counter register RCNT with the low-frequency clock signal LPclk in the standby mode, and to clock the access to the counter register RCNT with the high-frequency clock signal HSclk in the run mode.

A clear distinction is made between the clocking of the access to the counter register RCNT, that is to say the frequency for refreshing the data contained in the register, and the updating of the value contained in the register, that is to say the incrementation of the value of the time base controlled at a given frequency. Here, the term "incrementation" means the increase of said value of a quantity corresponding to the passage over time of a period at said given frequency, which is therefore not necessarily unit value of a time measurement unit.

Moreover, in the standby mode VEI, the central processing unit CPU is inactive and in particular does not establish access to the counter register RCNT. Consequently, the clocking of the access to the counter register RCNT during the standby mode VEI does not functionally need to be developed, but it could nevertheless be considered that it would be carried out, as the updating of the value contained, by the low-frequency clock signal LPclk.

Thus, the counter register RCNT is not only updated and running in the standby mode, which makes it possible particularly to be able to generate a programmed interrupt to "wake up" the microcontroller MCU from the standby mode to the run mode, and is furthermore clocked by the high-frequency clock signal in the run mode, which makes a rapid access possible with a low latency at the counter register RCNT.

For example, as illustrated below in relation to FIGS. 2, 4 and 6, the counter register includes a read register CNT (FIGS. 2, 4, 6) read accessible by the central processing unit CPU and containing said value of the reference time base, as well as a comparison register CMP (FIGS. 2, 4, 6) write accessible by the central processing unit CPU and containing a value of a programmed interrupt instant.

The comparison register CMP is thus intended to contain the value of an instant, compared to the current value of the reference time base, making it possible to generate an interrupt when the value of the reference time base reaches or exceeds the value contained in the comparison register CMP.

The interrupt may for example be an interrupt to wake up from the standby mode to the run mode, or the startup of one or more processes (in a multitask context), or the signaling of a "timeout".

Finally, the updating of the value of the reference time base contained in the counter register RCNT may be updated in different ways, in particular by the low-frequency clock signal LPclk in the standby mode, and particularly by the high-frequency clock signal HSclk or the low-frequency clock signal LPslk in the run mode.

Examples of embodiments and implementations particularly for the clocking and the updating of the value of the reference time base contained in the counter register RCNT are described below in relation to FIGS. 2 to 7.

Figure 2:
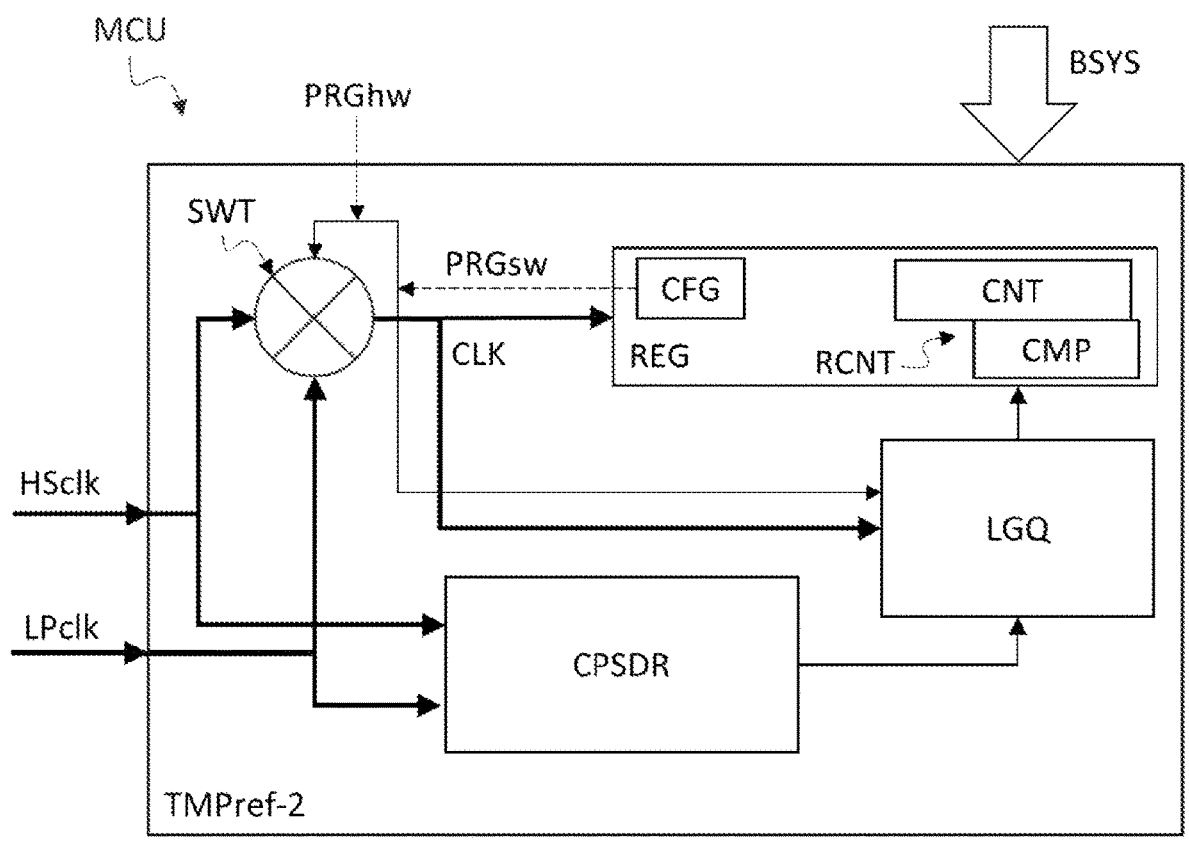
FIG. 2 illustrates an embodiment of a time reference circuit such as described above in relation to FIG. 1.

FIG. 2 illustrates an example of embodiment of the time reference circuit TMPref such as described above in relation to FIG. 1.

In this example, the time reference circuit TMPref-2 includes on the one hand a switching circuit SWT configured to select either the low-frequency clock signal LPclk in the standby mode, or the high-frequency clock signal HSclk in the run mode. The selected clock signal is transmitted as a useful clock signal CLK.

To select the clock signal LPclk, HSclk according to the operating mode of the microcontroller MCU, the switching circuit SWT may be controlled by a hardware control signal PRGhw or by a software control signal PRGsw. The hardware control signal PRGhw is for example physically generated by the microcontroller MCU, to communicate the standby or run operating mode in which it is found. The software control signal PRGsw is for example from the activity of the operating system, and may typically be written in a configuration register CFG belonging to a register bank REG of the time reference circuit TMPref.

The useful clock signal CLK is distributed on the one hand to the counter register RCNT, to clock the access to said counter register RCNT, that is to say the read access of the read register CNT, and the write access of the comparison register CMP.

The useful clock signal CLK is distributed on the other hand to a software circuit LGQ configured to update the value of the reference time base by an increment corresponding to the frequency of the useful clock signal CLK, in a clocked manner by the useful clock signal CLK.

In details, the software circuit LGQ is thus configured to update the value of the reference time base by an increment corresponding to the duration of the period (i.e. the inverse of the frequency) of the low-frequency clock signal LPclk, at each period of the low-frequency clock signal LPclk in the standby mode; and to update the value of the reference time base by an increment corresponding to the duration of the period of the high-frequency clock signal HSclk, at each period of the high-frequency clock signal HSclk in the run mode.

Advantageously, the time reference circuit TMPref-2 may further include a drift compensation circuit CPSDR configured to realign the value of the reference time base CNTval (FIG. 3), updated at each period of the high-frequency clock signal HSclk in the run mode.

The drift compensation circuit CPSDR receives as input the low-frequency clock signal LPclk and the high-frequency clock signal HSclk, and generates an output signal adapted to control the logic circuit LGQ in such a way as to perform the realignment.

Figure 3:
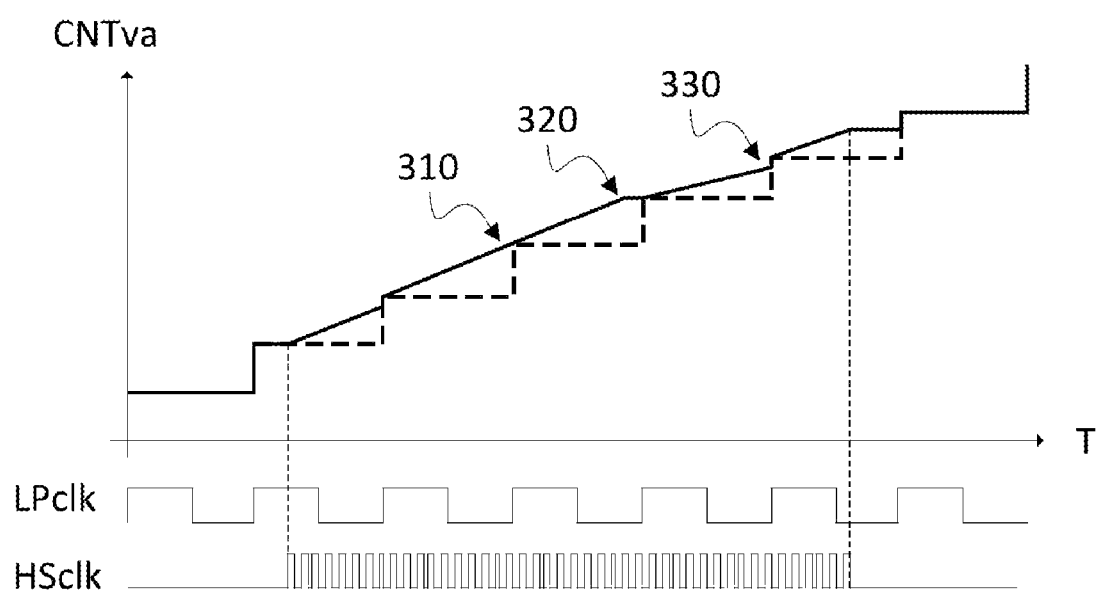
FIG. 3 illustrates an evolution of a value of the reference time base in relation to the real time.

In this regard, reference is made to FIG. 3.

FIG. 3 illustrates the evolution of the value of the reference time base CNTval, in relation to the real time T, and depending on possible drifts of the second frequency (i.e. the frequency of the high-frequency clock signal HSclk), and the realignment process 320, 330.

The realignment process, implemented by the drift compensation circuit CPSDR, is disciplined by the low-frequency clock signal LPclk, that is to say that it is considered that the low-frequency clock signal LPclk does not drift, the latter being used as reference if the second frequency HSclk tends to drift.

The drift compensation circuit CPSDR is for example configured to count the number of periods of the high-frequency clock signal HSclk during a period of the low-frequency clock signal LPclk.

If the number of periods is equal to the expected value of the ratio of the second frequency (i.e. the frequency of the high-frequency clock signal HSclk) to the second frequency (i.e. the frequency of the low-frequency clock signal LPclk), then the high-frequency clock signal has not drifted (310). If the number of periods counted is higher than the expected value of the ratio of the second frequency to the first frequency, then the high-frequency clock signal is too fast (320). Conversely, if the number of periods counted is lower than the expected value of the ratio of the second frequency to the second frequency, then the high-frequency clock signal is too slow (330).

For example, if the first frequency LPclk equals 32 kHz, and the second frequency HSclk equals 32 MHz, the ratio of the second frequency to the first frequency equals 1000, and the value of the reference time base CNTval is incremented by 1 at each period of the high-frequency clock signal HSclk.

At the next period of the low-frequency clock signal LPclk, the value of the reference time base CNTval is realigned on a value modulo said ratio of the frequencies (i.e. 1000). "A value modulo the ratio" means "a zero value modulo the ratio", which means "a value equal to a multiple integer of the ratio". The values modulo said ratio are shown by the curve in dotted lines.

Thus, when the high-frequency clock signal HSclk is too slow, then the value CNTval jumps 330 (FIG. 3) to the next modulo value; and when the high-frequency clock signal HSclk is too fast, the value CNTval stops 320 (FIG. 3) at the modulo value.

Thus, the value of the reference time base CNTval is incremented modulo woo by the realignment process, at each period of the low-voltage clock signal LPclk.

Figure 4:
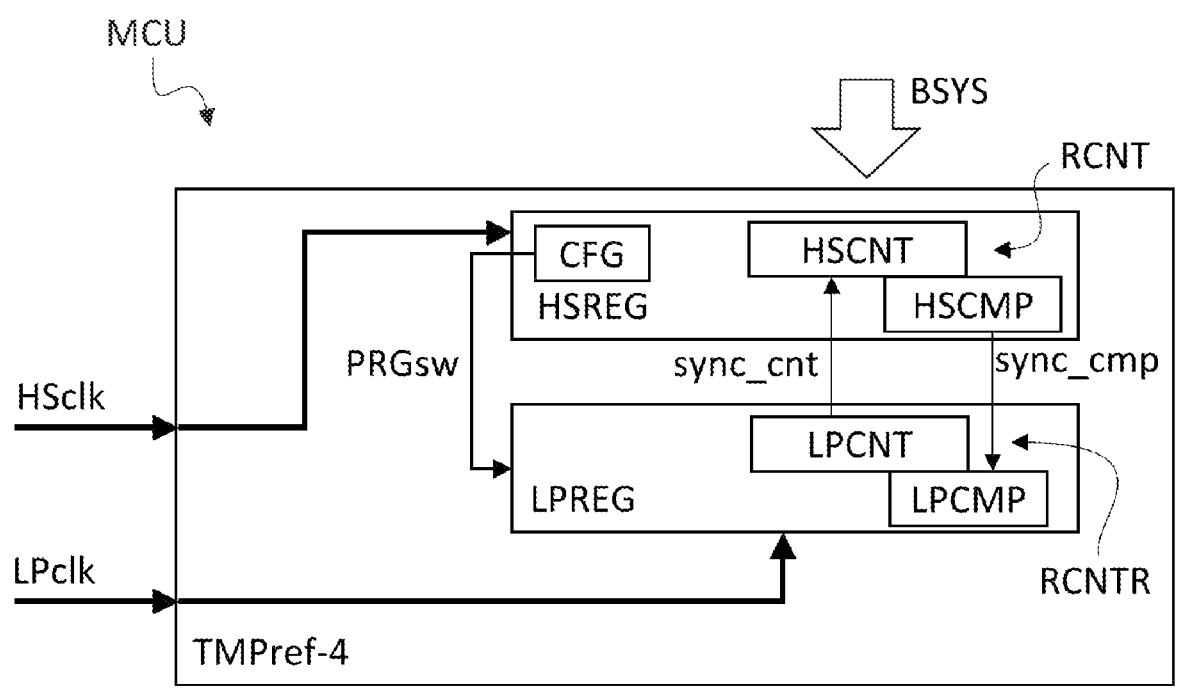
FIG. 4 illustrates an embodiment of a time reference circuit such as described above in relation to FIG. 1.

FIG. 4 illustrates an example of embodiment of the time reference circuit TMPref such as described above in relation to FIG. 1.

In this example, the time reference circuit TMPref-4 is configured to update the value of the reference time base, contained in the counter register RCNT, at each period of the low-frequency clock signal LPclk in the standby mode and in the run mode, while the access to the counter register RCNT is clocked with the high-frequency clock signal HSclk in the run mode.

In this regard, the time reference circuit TMPref-4 includes on the one hand a so-called high-frequency register bank HSREG, comprising the counter register RCNT, the access of which is clocked by the high-frequency clock signal HSclk in the run mode. In addition, the time reference circuit TMPref-4 includes on the other hand a so-called low-frequency register bank LPREG, comprising a root counter register RCNTR, which is updated and clocked by the low-frequency clock signal LPclk in the run mode and in the standby mode.

The counter register RCNT of the high-frequency register bank HSREG includes, as previously described, a read register HSCNT and intended to contain said value of the reference time base, as well as a comparison register HSCMP containing a value of a programmed interrupt instant, respectively read and write accessible by the central processing unit CPU.

The high-frequency register bank HSREG further contains a configuration register that may contain a software control PRGsw, making it possible to communicate the run or standby state of the microcontroller MCU. A hardware control PRGhw such as previously described in relation to FIG. 2 may be envisaged.

The root counter register RCNTR of the low-frequency register bank LPREG includes in a similar manner a read register LPCNT configured to contain a root value of the reference time base, updated at each period of the low-frequency clock signal LPclk, and a comparison register CMP intended to contain a value of a programmed interrupt instant.

The value of the reference time base of the counter register RCNT accessible by the central processing unit in the run mode, is synchronised with a synchronisation signal sync_cnt on the root value contained in the read register LPCNT of the root counter register RCNTR, in the standby mode and in the run mode.

The value of the programmed interrupt instant contained in the comparison register LPCMP of the root counter register RCNTR, is synchronised with a synchronisation signal sync_cmp on the value of the comparison register HSCMP of the counter register RCNT, in particular in the run mode.

Figure 5:
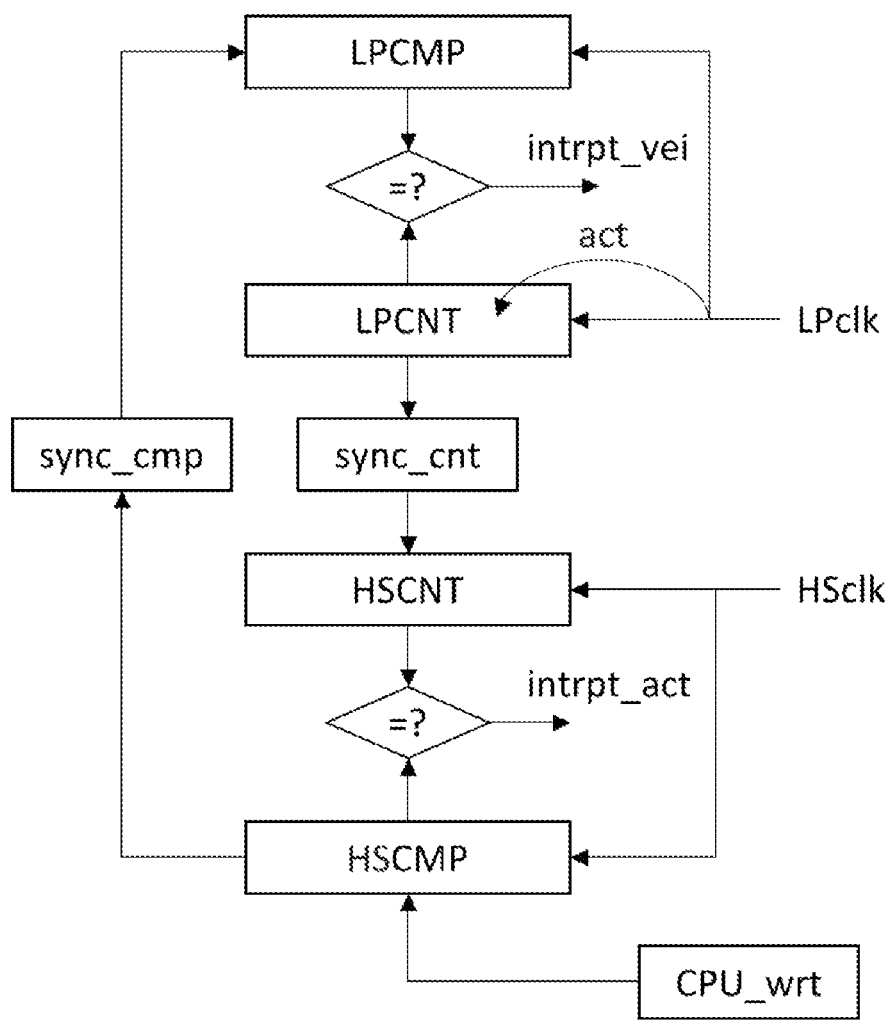
FIG. 5 illustrates an operation of the synchronisations between the values contained in the counter register and the root counter register of an embodiment.

FIG. 5 illustrates an organisation chart of the operation of the synchronisations sync_cnt, sync_cmp between the values contained in the counter register RCNT and the root counter register RCNTR.

In the standby mode, the accesses to the root read register LPCNT and to the root comparison register LPCMP are on the one hand clocked by low-frequency clock signal LPclk, and on the other hand, the root value contained by the root read register LPCNT is updated "act" at each period of the low-frequency clock signal LPclk.

At each period of the low-frequency clock signal LPclk, the root value (LPCNT) is compared with the value of the interrupt instant (LPCMP), and an interrupt intrpt_vei is generated when said values are equal. In standby mode, the interrupt intrpt_vei is typically a wake-up interrupt for a transition of the microcontroller MCU in the run mode.

In the run mode, the high-frequency clock signal HSclk is available and makes it possible to clock the access to the read register HSCNT and to the comparison register HSCMP, while the root read register LPCNT is always clocked and updated "act" by the low-frequency clock signal LPclk.

The value of the reference time base of the high-frequency read register HSCNT, accessible by the central processing unit CPU, is synchronised sync_cnt on the value of the root counter register RCNTR, for example at each period of the low-frequency clock signal.

The value of the interrupt instant of the high-frequency comparison register HSCMP, may be written (or programmed) by the central processing unit CPU_wrt, at the speed of the clocking by the high-frequency clock signal HSclk.

The programming of a new interrupt instant value may for example last a few periods, for example three periods, of the clock signal clocking the access to the comparison register HSCMP.

The mechanism for generating interrupts intrpt_act in the run mode is implemented in a similar manner, by comparing the value contained in the comparison register HSCMP with the current value of the read register HSCNT, at each period of the high-frequency clock signal HSclk.

Consequently, the central processing unit CPU may rapidly program useful interrupts intrpt_act in the run mode, for example for software applications, without being constrained by the latency of the writing in the comparison register HSCMP.

On the other hand, the value of the interrupt instant of the low-frequency comparison register LPCMP is synchronised sync_cmp on the value of the high-frequency comparison register HSCMP, in particular during an entry into the standby mode.

Synchronisation processes exist between domains clocked at different frequencies, making it possible to avoid conflicts in case of modification of the synchronised value in the high-frequency domain during the transfer, slower, to the low-frequency domain. This is advantageous for synchronising the values of the interrupt instants sync_cmp, given that the synchronisation is carried out from the high-frequency domain to the low-frequency domain, and that the synchronised value may be modified from the high-frequency domain. However, synchronising the values of the reference time base sync_cnt does not encounter the problem of conflict caused by a modification during the transfer, given that the synchronisation is carried out from the low-frequency domain to the high-frequency domain, and that the synchronised value is not modified from the high-frequency domain.

Figure 6:
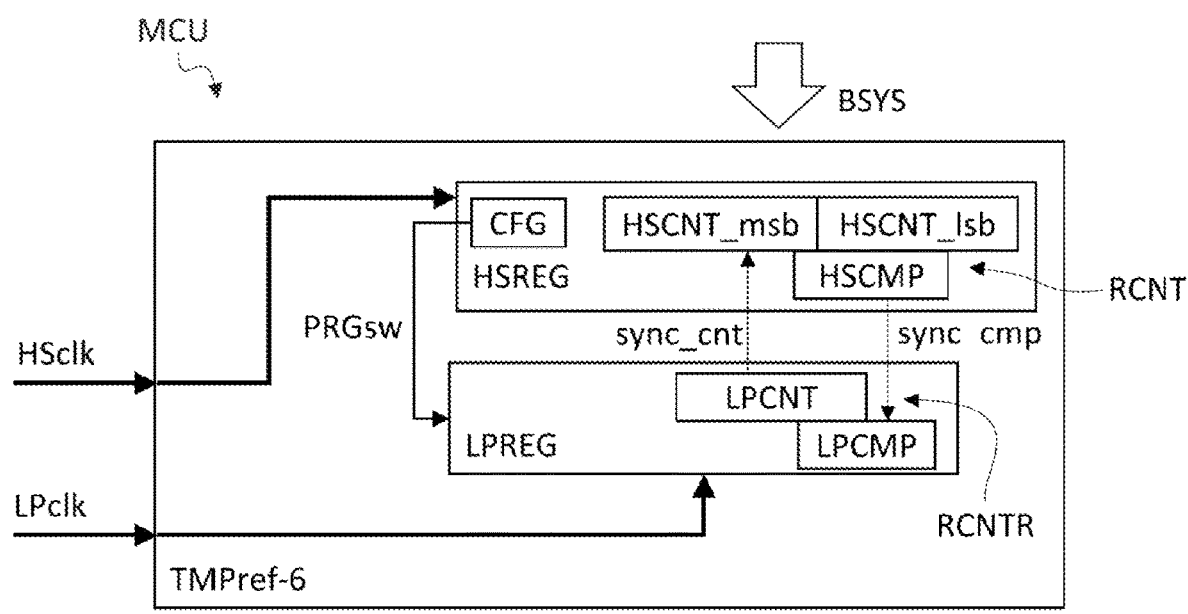
FIG. 6 illustrates another embodiment of the time reference circuit such as described above in relation to FIG. 1.

FIG. 6 illustrates another example of embodiment of the time reference circuit TMPref such as described above in relation to FIG. 1, that can be seen as a variant of the example described in relation to FIGS. 4 and 5. The common elements support the same references and not all will be detailed again.

Figure 7:
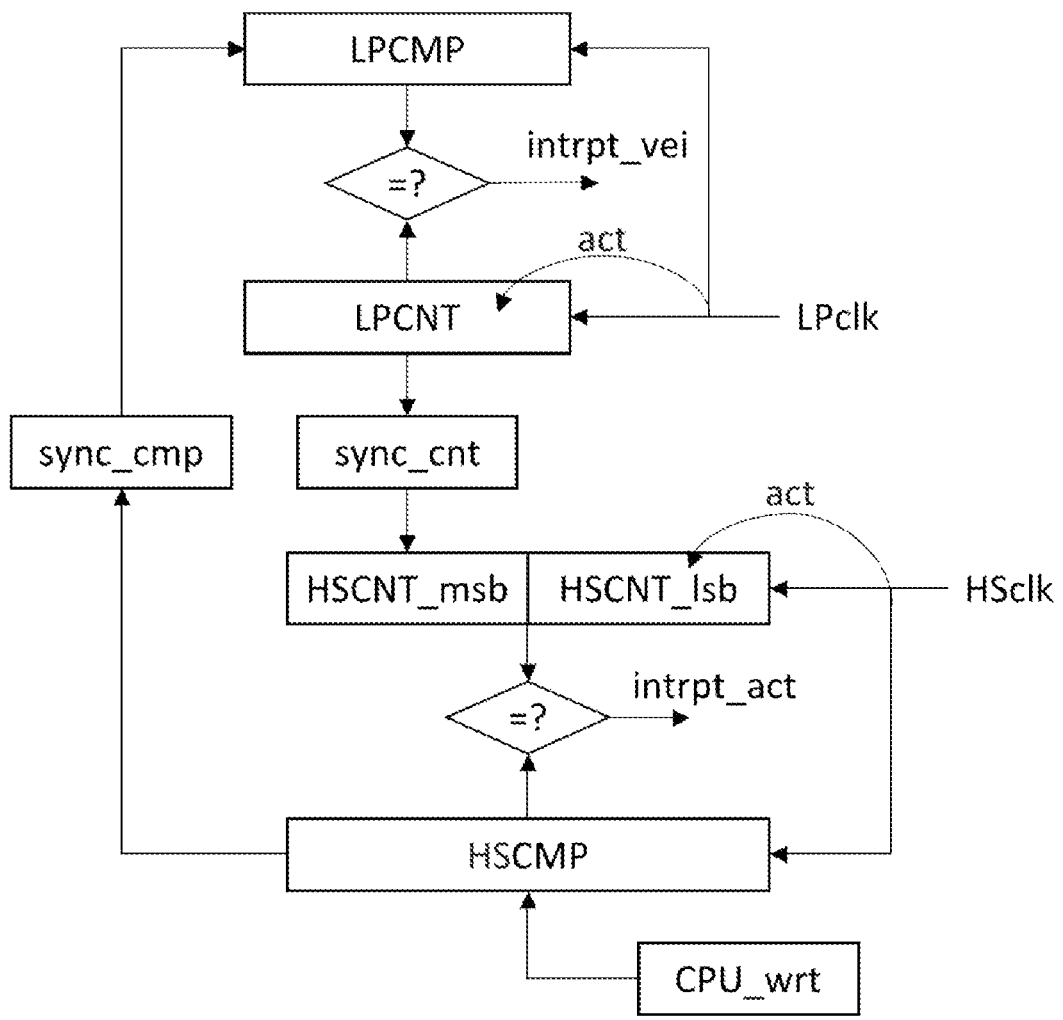
FIG. 7 illustrates an operation of the synchronisations between the counter register RCNT and the root counter register RCNTR of another embodiment.

FIG. 7 illustrates an organisation chart of the operation of the synchronisations between the counter register RCNT and the root counter register RCNTR of this variant.

In this variant, the read register HSCNT (belonging to the counter register RCNT located in the high-frequency register bank HSREG) includes a functional separation between the high weight bits HSCNT_msb and the low weight bits HSCNT_lsb of the value of the reference time base.

The time reference circuit TMPref-6 is configured to update the value of the high weight bits HSCNT_msb at each period of the low-frequency clock signal LPclk in the standby mode and in the run mode.

The updating of the high weight bits HSCNT_msb is carried out in the same way as described above in relation to FIGS. 4 and 5, that is to say by the synchronisation mechanism sync_cnt on the root value of the root read register LPCNT that is clocked and updated "act" by the low-frequency clock signal LPclk.

The time reference circuit TMPref-6 is at the same time configured to update "act" the value of the low weight bits HSCNT_lsb at each period of the high-frequency clock signal HSclk in the run mode.

For example, it is possible to construct the high-frequency counter register RCNT so that it contains words or data (that is to say the values contained in the read register HSCNT_msb, HSCNT_lsb and in the comparison register HSCMP) having a larger size than the words or data contained in the root counter register RCNTR.

For example, the values contained in the high-frequency counter register RCNT may be coded on 64 bits, with 32 high weight bits HSCNT_msb and 32 low weight bits HSCNT_lsb, while the values contained in the root counter register RCNTR may be coded on 32 bits. A mechanism for coherence between the high weight bits HSCNT_msb and the low weight bits HSCNT_lsb may be provided. Likewise, a mechanism for converting from 64 bits to 32 bits may be provided for the synchronisation sync_cmp of the interrupt instant value from the comparison register HSCMP to the comparison register LPCMP. In practice, the conversion mechanism (sync_cmp) may simply include a copy of high weight bits from the register HSCMP to the register LPCMP.

Alternatively, the values contained in the high-frequency counter register RCNT may be coded on 32 bits, with a breakdown of for example 24 high weight bits HSCNT_msb and 8 low weight bits HSCNT_lsb, or 28 high weight bits HSCNT_msb and 4 low weight bits HSCNT_lsb, for values contained in the root counter register RCNTR coded on 32 bits. A mechanism for converting from 32 bits to 24 bits or 28 bits may there again be provided for the synchronisation sync_cnt of the value of the reference time base of the read register HSCNT, based on the root value of the root read register LPCNT.

The breakdown may advantageously make it possible to modulate a compromise between the dynamics of the high weight bits HSCNT_msb, which tends to be the highest possible, and the precision of the low weight bits HSCNT_lsb, for which the microsecond may be sufficient and the nanosecond superfluous, according to the needs of the software applications.

The breakdown of high weight bits HSCNT_msb and low weight bits HSCNT_lsb may advantageously be programmable during use, according to a specification of the needs of the software applications executed.

Finally, in this variant, a mechanism for realigning the value of the low weight bits HSCNT_lsb on the low-frequency clock signal LPclk similar to the realignment described previously in relation to FIG. 3 may be implemented directly by the counter register RCNT.

Indeed, the counter register RCNT may be configured to implement said realignment, either by resetting the low weight bits HSCNT_lsb at the end of said period of the low-frequency clock signal LPclk, or by locking the value of the low weight bits HSCNT_lsb at a limit value equal to the ratio of the second frequency (i.e. the frequency of the high-frequency clock signal HSclk) to the first frequency (i.e. the frequency of the low-frequency clock signal LPclk), until the end of said period of the low-frequency clock signal LPclk.

This corresponds to a single-shot (as opposed to free-running) operation of the counter register RCNT and reset at each period of the low-frequency clock signal LPclk. In other terms, the counter register RCNT is configured to stop when it reaches a limit value (equal to said ratio between the frequencies, woo in the example given previously in relation to FIGS. 2 and 3) and to restart at o at each period of the low-frequency clock signal LPclk. The central processing unit CPU may periodically update the limit value to minimise the error and compensate for the drift.

In summary, a technique for generating and communicating the value of the reference time base of the microcontroller, in a counter register permanently operating with a low-latency access for reading and programming in run mode has been described. The value of the reference time base may benefit from drift compensations and from a mode transition mechanism that may be automatic or programmable. In examples of embodiments, the counter register may be obtained by means of a counter duplicated in the high-frequency domain, or of a counter in the high-frequency domain based on a combination of a counter updated at high frequency in the run mode and of a counter always available updated at lower frequency.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for communicating a value of a reference time base stored in a counter register accessible by a central processing unit (CPU), the method comprising:
   generating a low-frequency clock signal, having a first frequency, in a standby mode and in a run mode of the CPU;
   generating a high-frequency clock signal, having a second frequency higher than the first frequency, in the run mode;
   updating the value of the reference time base at each period of the low-frequency clock signal in the standby mode; and
   accessing the counter register with the high-frequency clock signal in the run mode,
   wherein a value of the reference time base stored in a root counter register is updated at each period of the low-frequency clock signal in the standby mode and in the run mode, and wherein the value of the reference time base stored in the counter register is synchronized to the value of the reference time base of the root counter register at each period of the low-frequency clock signal in the run mode.

2. The method according to claim 1, wherein the counter register comprises:
a read register read accessible by the CPU and storing the value of the reference time base, and
a comparison register write accessible by the CPU and storing a value of a programmed interrupt instant.

3. The method according to claim 1, wherein the value of the reference time base is updated by an increment at each period of the low-frequency clock signal in the standby mode, and wherein the value of the reference time base is updated by an increment at each period of the high-frequency clock signal in the run mode.

4. The method according to claim 3, further comprising:
realigning the value of the reference time base, updated at each period of the high-frequency clock signal in the run mode, at each period of the low-frequency clock signal,
wherein realigning comprises either a jump to a next value equal to a multiple of a ratio of the second frequency to the first frequency at an end of the period of the low-frequency clock signal, or a stop on a value equal to a multiple of a ratio until the end of the period of the low-frequency clock signal.

5. The method according to claim 1,
wherein the counter register stores high weight bits and low weight bits of the value of the reference time base,
wherein the value of the high weight bits is synchronized to the value of the reference time base of the root counter register at each period of the low-frequency clock signal in the run mode, and
wherein the value of the low weight bits is updated at each period of the high-frequency clock signal in the run mode.

6. The method according to claim 5, further comprising realigning the value of the low weight bits on each period of the low-frequency clock signal, wherein realigning comprises either resetting the low weight bits at an end of the period of the low-frequency clock signal, or locking the value of the low weight bits at a limit value equal to a ratio of the second frequency to the first frequency until the end of the period of the low-frequency clock signal.

7. The method according to claim 1, wherein a value of a programmed interrupt instant stored in a comparison register of the counter register, write accessible by the CPU, is synchronized in a comparison register belonging to the root counter register before each transition from the run mode to the standby mode.

8. A microcontroller integrated circuit comprising:
a central processing unit (CPU);
a time reference circuit comprising a counter register configured to store a value of a reference time base and to be accessible by the CPU;
a first clock circuit configured to generate a low-frequency clock signal having a first frequency in a standby mode and in a run mode; and
a second clock circuit configured to generate a high-frequency clock signal having a second frequency higher than the first frequency in the run mode,
wherein the time reference circuit is configured to update the value of the reference time base at each period of the low-frequency clock signal in the standby mode, and to clock an access to the counter register with the high-frequency clock signal in the run mode,
wherein the time reference circuit further includes a root counter register configured to store a value of the reference time base updated at each period of the low-frequency clock signal in the standby mode and in the run mode,
wherein the time reference circuit is configured to synchronize the value of the reference time base of the counter register to the value of the reference time base of the root counter register at each period of the low-frequency clock signal in the run mode, and
wherein the integrated circuit is configured to operate in the standby mode and in the run mode.

9. The integrated circuit according to claim 8, wherein the counter register comprises a read register read accessible by the CPU and configured to store the value of the reference time base and a comparison register write accessible by the CPU and configured to store a value of a programmed interrupt instant.

10. The integrated circuit according to claim 8, wherein the time reference circuit comprises a logic circuit configured to update the value of the reference time base by an increment corresponding to the first frequency, at each period of the low-frequency clock signal in the standby mode, and to update the value of the reference time base by an increment corresponding to the second frequency, at each period of the high-frequency clock signal in the run mode.

11. The integrated circuit according to claim 10, wherein the time reference circuit further includes a drift compensation circuit configured to control the logic circuit in order to realign the value of the reference time base, updated at each period of the high-frequency clock signal in the run mode, at each period of the low-frequency clock signal, and wherein a realignment comprises either a jump to the next value equal to a multiple of a ratio of the second frequency to the first frequency at an end of the period of the low-frequency clock signal, or a stop on a value equal to a multiple of a ratio until an end of the period of the low-frequency clock signal.

12. The integrated circuit according to claim 8, wherein the counter register accessible by the CPU is adapted to store high weight bits and low weight bits of the value of the reference time base, and wherein the time reference circuit is configured to synchronize the value of the high weight bits to the value of the root counter register at each period of the low-frequency clock signal in the run mode, and to update the value of the low weight bits of the value of the reference time base at each period of the high-frequency clock signal in the run mode.

13. The integrated circuit according to claim 12, wherein the counter register accessible by the CPU is configured to realign the value of the low weight bits of the low-frequency clock signal, the realignment comprising either resetting the low weight bits at an end of the period of the low-frequency clock signal, or locking the value of the low weight bits at a limit value equal to a ratio of the second frequency to the first frequency until an end of the period of the low-frequency clock signal.

14. The integrated circuit according to claim 8, wherein the root counter register includes a comparison register, the time reference circuit being configured to synchronize a value of a programmed interrupt instant of the standby mode in a comparison register of the root counter register to a value of a programmed interrupt instant stored in the comparison register of the counter register write accessible by the CPU before each transition from the run mode to the standby mode.

15. The method according to claim 1, wherein the root counter register is not directly accessible by the CPU.

16. The integrated circuit according to claim 8, wherein the root counter register is not directly accessible by the CPU.

17. A method for communicating a value of a reference time base stored in a counter register accessible by a central processing unit (CPU), the method comprising:
   generating a low-frequency clock signal, having a first frequency, in a standby mode and in a run mode of the CPU;
   generating a high-frequency clock signal, having a second frequency higher than the first frequency, in the run mode;
   updating the value of the reference time base at each period of the low-frequency clock signal in the standby mode; and
   accessing the counter register with the high-frequency clock signal in the run mode,
   wherein the counter register stores the value of the reference time base in a large size data containing high weight bits and low weight bits,
   wherein a root counter register stores the value of a reference time base in a short size data containing the low weight bits,
   wherein the value of the reference time base containing the high weight bits and the low weight bits is synchronized to the value of the reference time base containing the low weight bits at each period of the low-frequency clock signal in the run mode.

18. The method according to claim 17, wherein the root counter register is not directly accessible by the CPU.

19. The method according to claim 17, wherein a value of the high weight bits is updated at each period of the low-frequency clock signal in the standby mode and in the run mode, and wherein a value of the low weight bits is updated at each period of the high-frequency clock signal.

20. The method according to claim 17, wherein the large size data is coded on 64 bits and the short size data is coded on 32 bits.

* * * * *